United States Patent
Schmaelzle et al.

(10) Patent No.: US 9,034,563 B2
(45) Date of Patent: May 19, 2015

(54) MICRO-TRUSS STRUCTURES HAVING IN-PLANE STRUCTURAL MEMBERS

(71) Applicant: Palo Alto Research Center Incorporated, Palo Alto, CA (US)

(72) Inventors: Philipp H. Schmaelzle, Mountain View, CA (US); Eugene M. Chow, Fremont, CA (US); Kai Melde, Stuttgart (DE)

(73) Assignee: Palo Alto Research Center Incorporated, Palo Alto, CA (US)

( * ) Notice: Subject to any disclaimer, the term of this patent is extended or adjusted under 35 U.S.C. 154(b) by 29 days.

(21) Appl. No.: 14/056,909

(22) Filed: Oct. 17, 2013

(65) Prior Publication Data

US 2015/0111158 A1 Apr. 23, 2015

(51) Int. Cl.
  *G02B 6/138* (2006.01)
  *G02B 6/12* (2006.01)
  *G03F 7/20* (2006.01)
  *G03F 7/00* (2006.01)

(52) U.S. Cl.
  CPC ............ *G02B 6/138* (2013.01); *G02B 6/12002* (2013.01); *G03F 7/20* (2013.01); *G02B 2006/1219* (2013.01); *G03F 7/0005* (2013.01)

(58) Field of Classification Search
  CPC ....... G03F 7/0005; G03F 7/0037; G03F 7/20; G03F 7/2006; G03F 7/2051; G03F 7/2053; G02B 6/138; G02B 6/12007; G02B 2006/1219
  USPC ................................................. 430/320, 321
  See application file for complete search history.

(56) References Cited

U.S. PATENT DOCUMENTS

| | | | |
|---|---|---|---|
| 6,274,288 B1 * | 8/2001 | Kewitsch et al. | ........ 430/270.14 |
| 7,382,959 B1 | 6/2008 | Jacobsen | |
| 7,687,132 B1 | 3/2010 | Gross et al. | |
| 8,197,930 B1 * | 6/2012 | Jacobsen et al. | ........... 428/315.5 |
| 8,367,306 B1 | 2/2013 | Doty et al. | |

OTHER PUBLICATIONS

Jacobsen, A. et al. "Micro-scale Truss Structures formed from Self-Propagating Photopolymer Waveguides", Advanced Materials 2007, vol. 19, No. 22, pp. 3892-3896.
Streppel, U. et al. "Formation of micro-optical structures by self-writing processes in photosensitive polymers", Applied Optics, Vol. 42, No. 18, Jun. 20, 2003, pp. 3570-3579.
(Continued)

*Primary Examiner* — John A McPherson
(74) *Attorney, Agent, or Firm* — Bever, Hoffman & Harms, LLP (57) ABSTRACT

An enhanced self-writing method for generating in-plane (horizontally-oriented) polymer lightguides that includes disposing one or more light deflecting structures in or on the upper surface of a uncured layer that deflect incident collimated light beams in a transverse direction (i.e., parallel to the uncured layer top layer surface), whereby the deflected collimated light beam polymerizes a corresponding elongated portion of the uncured material in a self-propagating manner to form in-plane polymer lightguides. When used in the fabrication of micro-truss structures, the in-plane polymer lightguides are linked to diagonal polymer lightguides to form superior truss configurations, such as that of the ideal octet-truss structure. Non-polymerized portions of the uncured layer are removed to expose the micro-truss structure for further processing.

19 Claims, 9 Drawing Sheets

(56) References Cited

OTHER PUBLICATIONS

Deshpande, V. S. et al. "Effective properties of the octet-truss lattice material", Journal of the Mechanics and Physics of Solids, No. 49, 2001, pp. 1747-1769.

Meissner, C. "Materials by Design: Additive manufacturing techniques deliver three-dimensional microstructures with previously unobtainable material properties", Science & Technology Review, Lawrence Livermore National Laboratory, Mar. 9, 2012, 7 pgs., https://str.llnl.gov/Mar12/spadaccini.html.

Thiel, M. et al. "Three-dimensional laser lithography: A new degree of freedom for science and industry", Optik & Photonik, No. 4, Dec. 2011, pp. 36-39.

\* cited by examiner

MICRO-TRUSS STRUCTURES HAVING IN-PLANE STRUCTURAL MEMBERS

FIELD OF THE INVENTION

The present invention is directed to a method and/or system for fabricating polymer micro-truss structures, and in particular for fabricating polymer micro-truss structures having substantially in-plane structural elements.

BACKGROUND OF THE INVENTION

Micro-truss structures (micro-trusses) are ordered three-dimensional (3D) open-cell frameworks typically formed by straight, elongated interconnected polymer strut-like structural elements. Micro-truss structures can be used as is, or used as templates to form ordered 3D micro-truss structures with other materials, such as metals or ceramics. Micro-truss structures are considered promising mechanical meta-materials for a number of applications such as in lightweight structural materials for building aircraft, 3D-routed optical cross connects, medical stents, batteries with volume structured electrodes, fuel cells, catalytic converters, and acoustic volume absorbers.

Several serial and parallel micro-truss fabrication methods have been proposed. Serial production methods include serial additive deposition processes, e.g., using inkjet-like systems (i.e., similar to "3D printing"), and serial self-writing methods that use 2-photon lithography (e.g., using Nanoscribe tools) to form the desired micro-truss topology inside a monomer volume. Although serial methods facilitate the generation of highly complex micro-truss topologies, these methods are too slow to create large volumes of micro-truss structures at a practical cost. In contrast, parallel self-writing methods facilitate the generation of micro-truss structures in high volumes at relatively low cost, but at the expense of some generality. Conventional parallel micro-truss fabrication methods typically involve a self-writing polymerizing process in which multiple truss elements are generated simultaneously (i.e., in parallel) to facilitate generating large area micro-truss structures on a commercially feasible scale. Because the present invention builds on conventional parallel self-writing micro-truss fabrication methods, both the general concept of self-writing polymerization and the properties and limitations of conventional parallel self-writing micro-truss fabrication methods are summarized in the following paragraphs.

Self-writing polymerization is a well-known effect in uncured materials (e.g., negative photoresists) that react to light exposure by undergoing polymerization in a way that produces both increased structural strength and an increase in refractive index. The increased refractive index reaction facilitates the generation of self-propagating lightguides (i.e., cylindrical polymer structures with slightly higher index than its surroundings) through the use of collimated light beams. That is, as a cylindrical region of the uncured material is polymerized by a collimated light beam, it forms a cylindrical polymer lightguide structure having a lower refractive index than the surrounding uncured material, whereby the cylindrical polymer lightguide structure serves to self-propagate (self-write) its own lengthwise growth by guiding the light beam deeper into the uncured material. Results show that this self-writing method is controllable tightly enough to allow for reasonably long, straight lightguides that, when directed in a manner that causes two lightguides to intersect without deleterious effects (i.e., a substantially integral interlocking joint is produced by the polymerized material forming the intersection, and the second lightguide is able to continue in a substantially straight line after the intersection).

Conventional parallel self-writing micro-truss fabrication methods takes advantage of the self-writing method to simultaneously generate a large number of parallel lightguide (truss) elements, for example, by directing collimated light through a reservoir containing a uncured using a mask with multiple apertures (openings), whereby elongated portions of the uncured exposed to collimated light beams passing through the apertures are polymerized to form the parallel micro-truss structural elements. After generating parallel micro-truss structural elements that extend in a first direction, the reservoir (or light source) is rotated, and the collimated light is again passed through the mask apertures to form a second set of parallel micro-truss structural elements extending in a second direction. A 3D open-cell micro-truss framework is thus formed by directing the collimated light at four or more predetermined angles through the apertures, whereby the generated structural elements extend at predetermined angles and fuse together at intersections. The excess uncured is then developed and drained from the reservoir, the mask is removed, and the micro-truss structure is cleaned and subjected to further processing (e.g., a thermal post-cure process that leaves the micro-truss stiff enough to be self-supporting, and removal from its supporting substrate).

While the above-described conventional parallel self-writing micro-truss fabrication method yields impressive results, it is limited to straight lightguide members at limited angles (e.g., 30 to 40 degrees from the surface normal) due to refraction, aperture shrinking and other issues that occur at oblique angles. Specifically, it is not possible to fabricate micro-truss structures having in-plane structural (lightguide) elements, which are very important for the mechanical properties of micro-truss frameworks, using the conventional parallel self-writing method. Consequently, the conventional parallel self-writing micro-truss fabrication method cannot be used to generate superior micro-truss structures, such as those having the "Octet Truss" topology, which was identified by Buckminster Fuller and others as an ideal space frame unit.

What is needed is an enhanced self-writing method that overcomes the limitations of the conventional methodologies to allow for the low-cost, large-scale fabrication of micro-truss structures having horizontal (in-plane) structural elements. In particular, what is needed is an enhanced self-writing method that facilitates the formation of in-plane (i.e., horizontally-oriented) polymer lightguides while retaining the (fast) self-writing characteristics associated with the conventional parallel micro-truss fabrication methodology, and does not introduce alignment requirements that preclude scalability to large area micro-truss structures.

SUMMARY OF THE INVENTION

The present invention is directed to an enhanced self-writing process for generating in-plane (horizontally-oriented) polymer lightguides that overcomes the limitations of the conventional methodology by disposing one or more light deflecting structures in or on the upper surface of a uncured layer, where the light deflecting structures are arranged such that each light deflecting structure deflects an incident collimated light beam in a transverse direction (i.e., parallel to the uncured layer top layer surface), whereby the deflected collimated light beam polymerizes a corresponding elongated portion of the uncured material in a self-propagating manner to form the desired in-plane polymer lightguide. Non-polymerized portions of the uncured layer are then optionally removed to expose the in-plane polymer lightguide for further processing. By utilizing embedded light deflecting structures to redirect light beams in a transverse direction through a uncured layer, the present invention greatly simplifies the batch-fabrication of in-plane polymer lightguides that can be utilized in a wide range of applications.

According to an embodiment of the present invention, a method for forming a micro-truss structure having horizontal structural members includes forming a uncured layer on a support surface with multiple light deflecting structures embedded therein, and then directing collimated light beams through the upper surface of the uncured layer at parallel first incident angles (e.g., perpendicular to the upper surface) such that each collimated light beam is directed toward a corresponding embedded light deflecting structure. The initial (vertical) portion of each light beam polymerizes an elongated (first) portion of the uncured layer to form a vertical (first) self-propagating polymer lightguide section that extends between the upper surface of the uncured layer and an associated embedded light deflecting structure. The associated embedded light deflecting structure is constructed to deflect (redirect) the vertical collimated light such that a second portion of each collimated light beam is directed in a horizontal (transverse) direction (i.e., parallel to the upper surface of the uncured layer), whereby these deflected second beam portions polymerize horizontally oriented elongated portions of the uncured layer, thereby forming horizontal (second) self-propagating polymer lightguide sections extending from each embedded light deflecting structure in a transverse direction into the uncured layer. To form micro-truss structures, these horizontal self-propagating polymer lightguide sections are generated such that they intersect and form an integral structural joint with, for example, diagonally generated self-propagating polymer lightguide members that are formed using conventional techniques. That is, by joining the horizontal and diagonal lightguide sections facilitate in a predetermined two- or three-dimensional pattern and then processing the resulting structure using known techniques, the present invention facilitates the low-cost production of superior micro-truss structures including horizontal structural members, such as the ideal octet truss structure, which are not possible using conventional techniques.

According to a specific embodiment of the present invention, laser light is utilized to form the light deflecting structures by polymerizing corresponding portions of the uncured material forming the uncured layer. In a specific embodiment, a 2-Photon-Lithography process is utilized to generate the light deflecting structures inside the uncured layer, thereby facilitating precise embedded positioning of light deflecting structures for subsequent processing. In accordance with an optional embodiment, the 2-Photon-Lithography process is also used to pattern a mask formed on the uncured layer (i.e., by developing portions of photoresist layer that are later used to define apertures (openings) in a mask layer, which is then used during formation of the self-propagating polymer lightguide sections). An advantage of using the same 2-Photon-Lithography process to both generate the embedded light deflecting structures and to define the mask openings is that this allows precise alignment of each mask opening relative to (e.g., directly over) an associated light deflecting structure), thereby facilitating low-cost large-area micro-structure fabrication.

According to another specific embodiment, a 2-Photon-Lithography process is used to generate light deflecting structures by controlling the lasers to polymerize (third) portions of the uncured material in a way that forms curved lightguide sections having first ends facing upward (i.e., toward the upper surface of the uncured layer) and side (second) ends facing a transverse direction (i.e., substantially parallel to the upper surface of the uncured layer). During subsequent processing, collimated light generates the vertical (first) self-propagating polymer lightguide sections extending between the upper layer surface and the upward-facing end of an associated curved lightguide section, and horizontal (second) self-propagating polymer lightguide sections extending from the side end of the associated curved lightguide section into the uncured layer. An advantage provided by utilizing curved-lightguide-type light deflecting structures is that the integral structure formed by the series-connected vertical-curved-horizontal lightguide sections is curved, which provides lower mechanical stress concentration and thus better mechanical strength in the final structure.

According to another specific embodiment, a 2-Photon-Lithography process is used to generate Bragg-type light reflecting structures by controlling the lasers to polymerize portions of the uncured material in a way that forms multiple polymerized layers that collectively form an associated reflective-type light deflecting structure having an outer surface disposed at an acute angle relative to the upper surface of the uncured layer. During subsequent processing, collimated light generates the vertical (first) self-propagating polymer lightguide sections between the upper layer surface and the outer surface of an associated reflective-type light deflecting structure, with the horizontal (second) self-propagating polymer lightguide sections extending from the outer surface into the uncured layer. An advantage provided by utilizing Bragg-type light deflecting structures is that these structures can have exceptionally high reflectivity.

According to yet another specific embodiment, reflecting-type light deflecting structures are formed (e.g., printed using an inkjet system or patterned from a deposited layer using photolithography) on a lower layer of uncured material, and then an upper layer of uncured material is formed over the lower layer and reflecting-type light deflecting structures. During subsequent processing, collimated light generates the vertical (first) self-propagating polymer lightguide sections through the upper layer of uncured material to the reflective surface of an associated reflective-type light deflecting structure, with the horizontal (second) self-propagating polymer lightguide sections extending from the reflective surface into the uncured layer. An advantage provided by utilizing printed-type light reflecting structures is that these structures can be integrated at low cost and easily customized for different geometries.

In accordance with a practical embodiment, the enhanced self-writing process of the present invention combines the novel horizontal-element fabrication process with the (fast) parallel self-writing techniques associated with the conventional methodology. Specifically, a uncured layer is formed on a support surface, a mask layer is formed and patterned over the uncured layer, diagonal (third) self-propagating polymer lightguides are generated by directing collimated light through apertures (openings) defined in the mask layer at acute (e.g., 30 to 40 degree) angles, and then horizontal (second) self-propagating polymer lightguide sections are generated using one of the various techniques described above such that each horizontal section intersects and forms a joint with one or more of the diagonal lightguides, whereby the interconnected lightguide sections collectively form a micro-truss structure including horizontal structural members. The micro-truss structure fabrication process is then completed, for example, by removing the mask and non-polymerized portions of the uncured layer, detaching the micro-truss structure from the support surface, cleaning and performing additional processing (e.g., conducting thermal-curing to stiffen the polymer framework). By incorporating the present method novel horizontal-element fabrication process with the conventional parallel self-writing techniques in this manner, the combined methodology produces micro-truss structures including interconnected vertical, diagonal and horizontal structural elements, thereby facilitating the large formation of superior micro-trusses. When micro-truss structure are desired that include horizontal lightguide members at multiple vertical depths, the lightguide formation process can be repeated in multiple sequentially formed uncured layers, or embedded light deflecting structures can be formed at multiple depths inside a single uncured layer. By combining the novel horizontal-element fabrication process with parallel self-writing techniques such that the interconnected vertical, diagonal and horizontal structural elements form three-dimensional frameworks, the present invention facilitates the formation of superior micro-truss structures configured, for example, in accordance with the ideal octet-truss structure.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in methods for forming in-plane lightguides and micro-truss structures. The following description is presented to enable one of ordinary skill in the art to make and use the invention as provided in the context of a particular application and its requirements. As used herein, directional terms such as "upper", "upward", "lower", "downward", "horizontal" and "horizontally oriented", are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
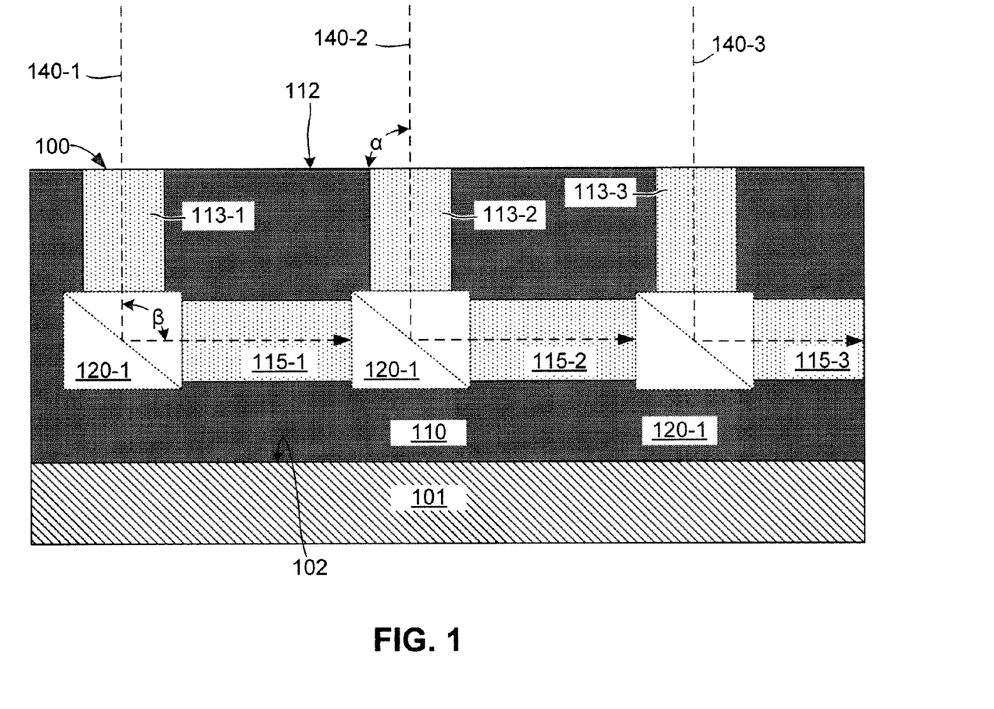
FIG. 1 is a cross-sectional diagram depicting an in-plane lightguide structure fabricated in accordance with a generalized embodiment of the present invention.
Figure 2:
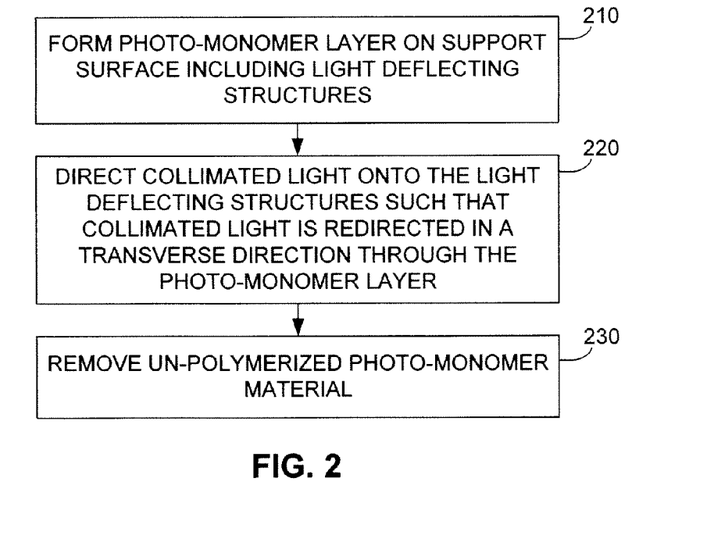
FIG. 2 is a flow diagram showing a basic method for generating the structure of FIG. 1 in accordance with the generalized embodiment.

FIG. 1 is a cross-sectional diagram depicting a simplified lightguide structure 100 fabricated in accordance with a generalized embodiment of the present invention, and FIG. 2 is a flow diagram showing a basic methodology utilized in the fabrication of lightguide structure 100. As indicated in FIG. 1, lightguide structure 100 is characterized by at least three components: at least one vertical lightguide section 113-1 to 113-3, at least one light deflecting structure 120-1 to 120-3, and one or more in-plane (horizontally oriented) lightguide section 115-1 to 115-3. Lightguide structure 100 is shown as being embedded inside a uncured material layer 110 that is disposed on a supporting substrate 101. Although material layer 110 and support structure 101 are not considered part of lightguide structure 100 in most embodiments described below, these structures may be retained in some embodiments.

As set forth below, in preferred embodiments the structure 100 and the associated fabrication method depicted in FIGS. 1 and 2 is combined with conventional parallel self-writing micro-truss fabrication methods to produce micro-truss structures having in-plane structural members suitable, for example, in the mass production of lightweight materials for building aircraft. However, the methodology is currently believed to have practical uses in other technologies that utilize the in-plane lightguides for light distribution, such as in optical communication systems. Therefore, although the description below primarily references the production of micro-truss structures, the methodology described below is not limited to this technology unless otherwise specified in the claims.

Referring block 210 of FIG. 2 and to FIG. 1, the generalized in-plane lightguide fabrication method begins with forming a uncured layer 110 on a planar upper (support) surface 102 of a support structure 101 such that uncured layer 110 includes at least one light deflecting structures 120-1 to 120-3. In alternative embodiments, light deflecting structures are either disposed in the uncured layer (e.g., between an upper surface 112 and support surface 102) or formed on a surface of uncured layer 110. In the exemplary embodiment, uncured layer 110 comprises a layer of negative photoresist (e.g., a thiol-ene type photoresist) having a thickness in the range of 1 μm and 1000 μm, and light deflecting structures 120-1 to 120-3 are embedded inside uncured layer 110.

Referring block 220 of FIG. 2 and to FIG. 1, collimated light beams 140-1 to 140-3 are respectively directed through upper surface 112 of uncured layer 110 at parallel (first) incident angles α (e.g., perpendicular to upper surface 112) such that each collimated light beam 140-1 to 140-3 is directed toward a corresponding one of light deflecting structures 120-1 to 120-3. According to an aspect of the invention, each collimated light beam 140-1 to 140-3 polymerizes a corresponding elongated portion of the uncured layer to form vertical (first) self-propagating polymer lightguide sections 113-1 to 113-3 that extend between upper surface 112 of uncured layer 110 and an associated embedded light deflecting structure 120-1 to 120-3. In addition, embedded light deflecting structures 120-1 to 120-3 are arranged such that directing collimated light beams 140-1 to 140-3 in a substantially perpendicular direction α through upper surface 112 onto light deflecting structures 120-1 to 120-3, respectively, causes redirection of collimated light beams 140-1 to 140-3 in the horizontal direction β (i.e., substantially parallel to upper surface 112), whereby the deflected light beams polymerize corresponding portions of layer 110 to generate in-plane (second) self-propagating polymer lightguide sections 115-1 to 115-3 that extend substantially parallel to upper surface 112. That is, collimated light beams 140-1 to 140-3 either pass through, are reflected, or are otherwise redirected by embedded light deflecting structures 120-1 to 120-3, respectively, such that each deflected collimated light beam 140-1 to 140-3 exit embedded light deflecting structures 120-1 to 120-3 along horizontal direction β, thereby causing each deflected collimated light beam 140-1 to 140-3 to polymerize a corresponding portion of uncured layer 110 to form horizontal self-propagating polymer lightguide sections 115-1 to 115-3.

Referring to block 230 at the bottom of FIG. 2, non-polymerized portions of the uncured layer are then optionally removed to expose the in-plane polymer lightguide (e.g., lightguides 115-1 to 115-3, shown in FIG. 1) for further processing. As explained below, the removal of polymerized is utilized, for example, in the batch-fabrication of micro-truss structures incorporating in-plane polymer lightguides 115-1 to 115-3.

The propagation distance of horizontal lightguides 115-1 to 115-3 is limited by absorption and scattering of the collimated light by the uncured material. That is, the self-writing process stops when these losses have attenuated light beams 140-1 to 140-3 too much to cause effective further exposure and propagation of the horizontal lightguides. Therefore, according to an embodiment of the present invention, to form continuous substantially horizontal lightguide elements, "feed in" points are required at regular intervals. In the generalized embodiment depicted in FIG. 1, these "feed in" points are implemented by forming light deflecting structures 120-1 to 120-3 such that light beams 140-1 to 140-3 are respectively deflected along a single line (i.e., such that horizontal segments 115-1 to 115-3 are collinear and collectively form an elongated in-plane lightguide structure). The use of such "feed in" points does not preclude the fabrication of structures that are many truss-layers in height because feed-in points for different elongated in-plane lightguide structures can be spaced several unit cells apart, with the light deflecting structures positioned at different vertical depths within the photo-polymer layer.

FIGS. 3A-3I depict the fabrication of in-plane lightguides using curved refractive-type light deflecting structures according to a first exemplary embodiment of the present invention, where laser light is used to form embedded light deflecting structures inside a photo-polymer layer.

Figure 3A:
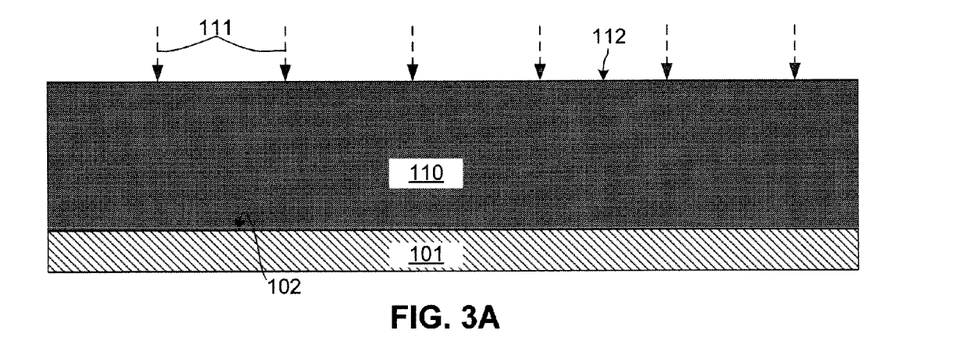
FIGS. 3A, 3B, 3C, 3D, 3E, 3F, 3G, 3H, and 3I are cross-sectional diagrams depicting the fabrication of an in-plane lightguide structure according to a first exemplary embodiment of the present invention.
Figure 3B:
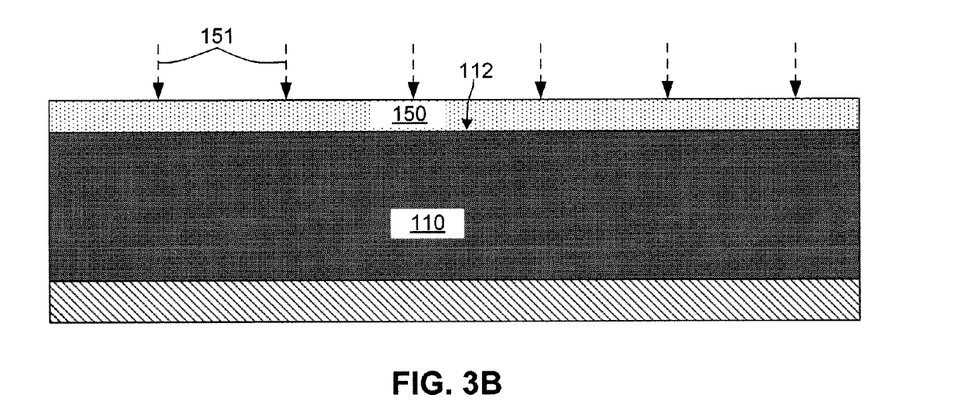

FIGS. 3A and 3B illustrates the formation of a uncured layer 110 on an upper (support) surface 102 of a support substrate 101, and the subsequent formation of a photoresist layer 150 (which is used to pattern the mask layer, as discussed below) on an upper surface 112 of uncured layer 110. Uncured layer 110 is formed (see FIG. 3A) by depositing a relatively thick layer of uncured material 111 (e.g., a negative photoresist such as thiol-ene type) using known techniques, and then photoresist layer 150 is formed (see FIG. 3B) by depositing (e.g., using a spin-on methods) a relatively thin layer of photo-resist material 151 (e.g., isoprene type resist) on upper surface 112 both layers being deposited using known techniques. Note that the photoresist utilized to generate photoresist layer 150 required "orthogonal developability", which is defined herein as meaning that the developing process for the photoresist layer 150 does not interfere with lower material layers (such as uncured layer 110).

Figure 3C:
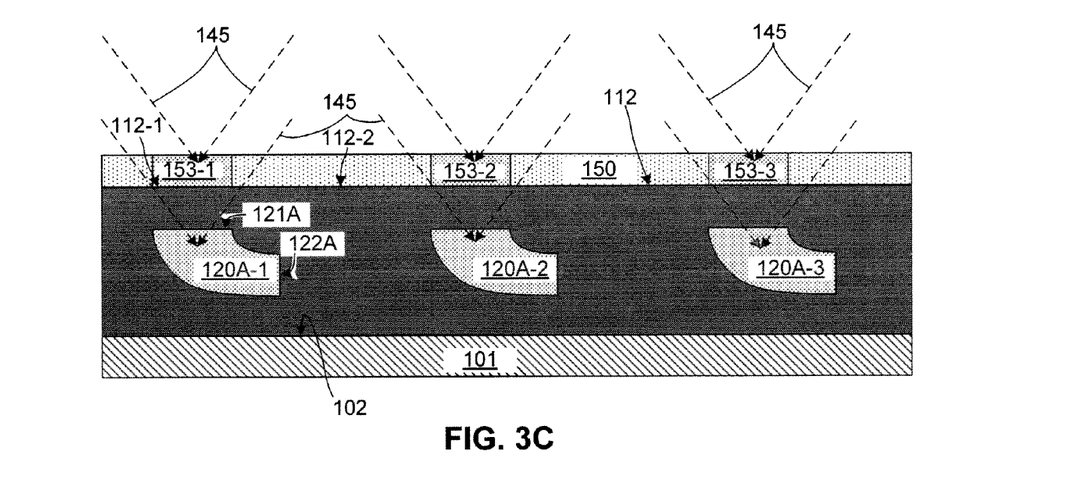

FIG. 3C depicts the subsequent 2-Photon Lithography process during which laser light 145 is used to generate embedded light deflecting structures 120A-1 to 120A-3 inside uncured layer 110. Specifically, laser light 145 is focused using known techniques such that it polymerizes selected portions of uncured material, whereby uncured layer 110 is processed to include embedded light deflecting structures 120A-1 to 120A-3 that are disposed between upper surface 112 of uncured layer 110 and support surface 102. In accordance with the present embodiment, laser light 145 is controlled such that each polymerized (third) portion forms an associated curved lightguide section 120A-1 to 120A-3 having an upward-facing (first) end 121A (i.e., facing upper surface 112), a side (second) end 122A facing the horizontal direction (i.e., substantially parallel to upper surface 112), and a curved body section that forms a gradual 90° bend between upward-facing end 121A and side end 122A. Provided curved 3 are producible as small enough structures, the writing time required to generate curved lightguide section 120A-1 to 120A-3 using a serial process such as 3D direct-write 2-Photon Lithography is acceptable. That is, because the bulk of each lightguide is generated using the parallel method described below with reference to FIGS. 3G to 3I, the use of serial writing to generate lightguide section 120A-1 to 120A-3 does not significantly increase production time and cost. A commercially available laser lithography system suitable for the 3D direct-write 2-Photon Lithography process described herein is commercially available from Nanoscribe GmbH of Eggenstein-Leopoldshafen, Germany.

Figure 3D:
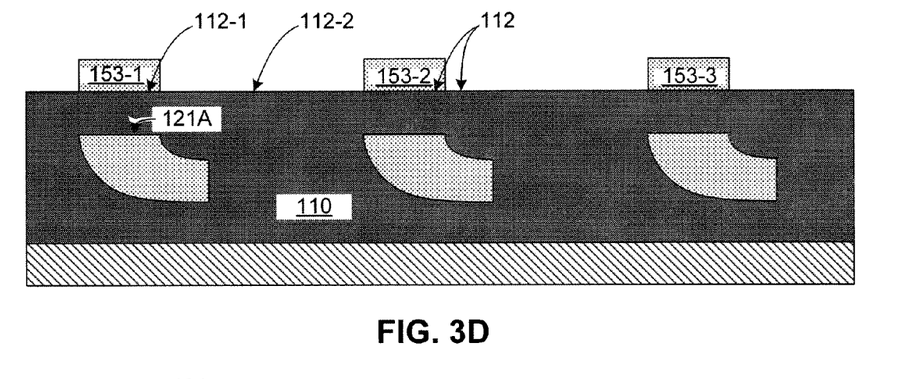
Figure 3E:
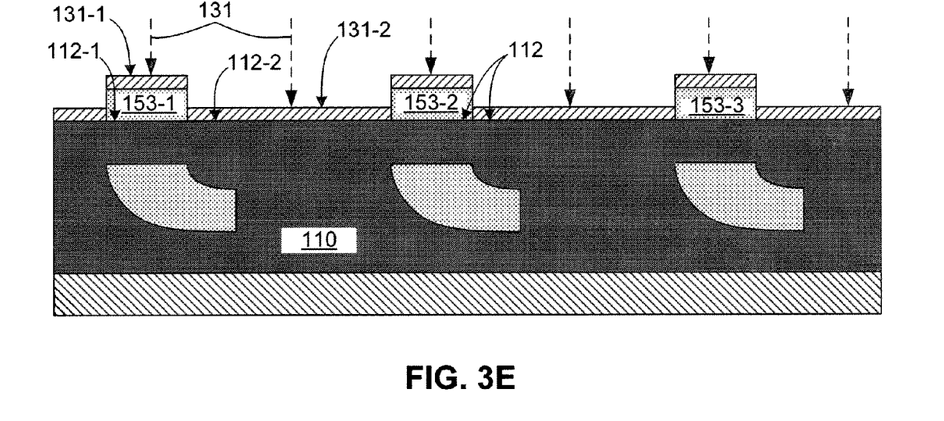
Figure 3F:
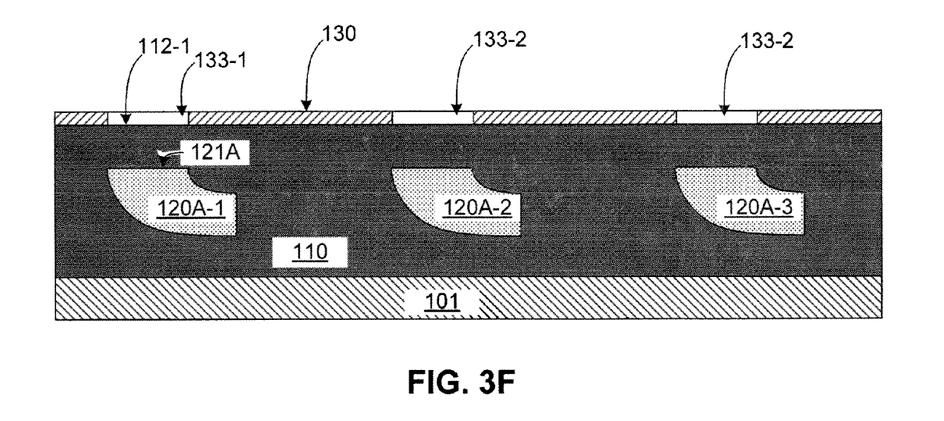

FIGS. 3C to 3F depict the formation of a mask that is utilized to generate collimated light beams during the parallel self-writing process utilized to generate the desired in-plane lightguide structures. Referring to FIG. 3C, in accordance with an aspect of the present embodiment, the same 2-Photon Lithography system utilized to generate light deflecting structures 120A-1 to 120A-3 is also used to develop spaced-apart photoresist portions 153-1 to 153-3 of photoresist layer 150. FIG. 3D shows the subsequent process of removing undeveloped portions of the photoresist layer, thereby exposing portions 112-1 of upper surface 112, and leaving spaced-apart developed photoresist structures 153-1 to 153-3 over "covered" portions 112-2 of upper surface 112. FIG. 3E shows the subsequent deposition of a protective mask material 131 (e.g., an aluminum film) such that (first) portions 131-1 of the mask material are disposed on the spaced-apart developed photoresist structures 153-1 to 153-3, and such that the remaining (second) mask material portions 131-2 form a mask layer 130 on exposed portions 112-2 of upper surface 112. FIG. 3F depicts the structure after subsequent lift-off (removal) of the developed photoresist structures and associated mask material portions, thereby completing the formation of mask layer 130 with apertures 133-1 to 133-3 that expose upper surface portions 112-1. The use of a single processing system (e.g., a 3D direct-write 2-Photon Lithography system) to both form light deflecting structures 120A-1 to 120A-3 and to pattern mask layer 130 facilitates precise alignment between apertures 133-1 to 133-3 and light deflecting structures 120A-1 to 120A-3, which in turn facilitates the parallel self-writing described below with reference to FIGS. 3G to 3I.

Figure 3G:
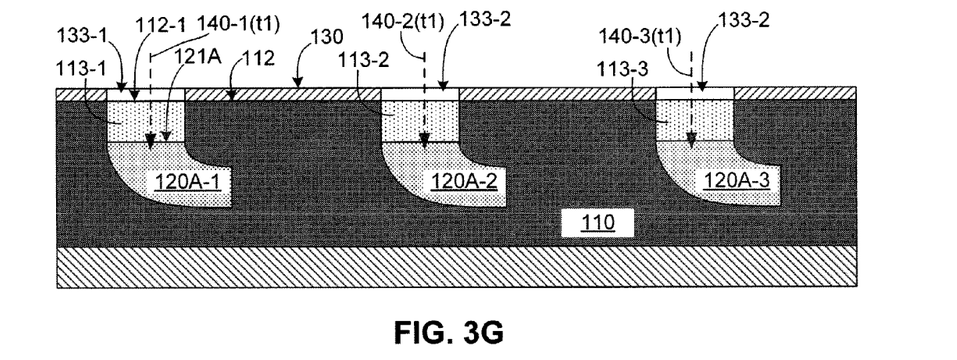
Figure 3H:
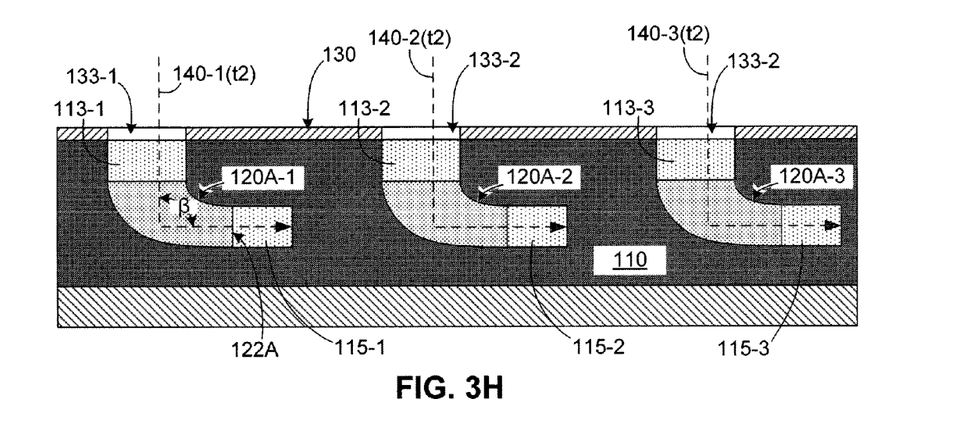
Figure 3I:
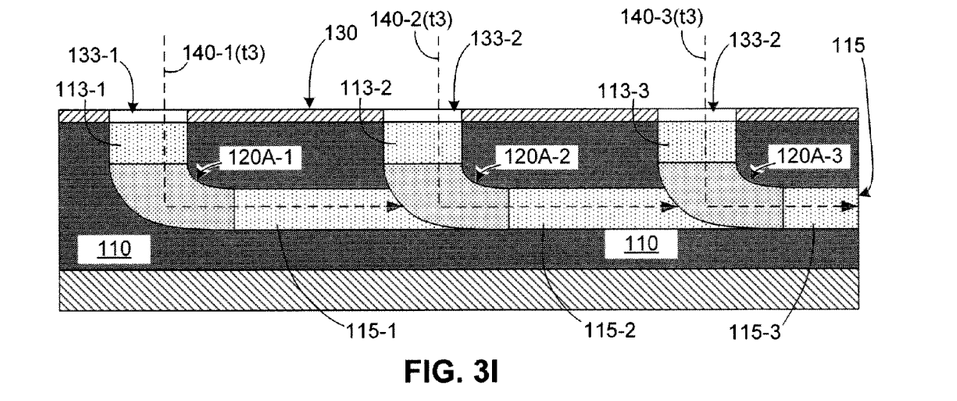

FIGS. 3G-3I depict the subsequent parallel self-writing process used to generate in-plane (horizontal) lightguides according to an exemplary embodiment of the present invention. In these figures, collimated light from a single collimated source (not shown) is directed onto mask 130 in a direction perpendicular to upper surface 112. Due to the presence of mask 130, most of the collimated light is prevented from entering uncured layer 110. However, the presence of apertures 133-1 to 133-3 allows beam-like collimated light portions (light beams) 140-1 to 140-3 to respectively enter corresponding portions of uncured layer 110 through upper surface 112. Referring to FIG. 3G, at a first time t1 when collimated light beams 140-1(t1) to 140-3(t1) first enter layer 110, the collimated light generates vertical (first) self-propagating polymer lightguide sections 113-1 to 113-3 that extend downward between upper surface 112. Because curved lightguide deflecting structures 120A-1 to 120A-3 are formed in uncured layer 110 such that upward-facing ends 121A are positioned directly below apertures 133-1 to 133-3, respectively, collimated light beams 140-1(t1) to 140-3(t1) generate vertical lightguide sections 113-1 to 113-3 such that they extend between 112 and ends 121A of curved lightguide deflecting structures 120A-1 to 120A-3, respectively. As indicated in FIG. 3H, at subsequent time t2 collimated light beams 140-1(t2) to 140-3(t2) is passed by vertical lightguide sections 113-1 to 113-3 into curved lightguide deflecting structures 120A-1 to 120A-3, respectively, and is then redirected from the vertical direction to the in-plane (horizontal or transverse) direction β, thereby exiting curved lightguide deflecting structures 120A-1 to 120A-3 through side ends 122A and forming corresponding horizontal (second) self-propagating polymer lightguide sections 115-1 to 115-3 that extend into uncured layer 110. As indicated in FIG. 3I, because curved lightguide deflecting structures 120A-1 to 120A-3 are disposed at a common depth and side ends 122A are aligned, at time t3 of the parallel self-writing process collimated light beams 140-1(t3) to 140-3(t3) cause horizontal lightguide sections 115-1 to 115-3 to abut adjacent curved lightguide deflecting structures, thereby forming a continuous elongated horizontal lightguide 115.

As illustrated by the exemplary embodiment shown in FIGS. 3G to 3I, the present invention facilitates using a single perpendicular collimated exposure source to parallel self-write transverse in-plane lightguide structures by causing portions (light beams) of the perpendicular light to self-writing vertical lightguide sections 113-1 to 113-3 such that they encounter and are turned by the previously defined "lightguide bends" (curved light deflecting structures 120A-1 to 120A-3), whereby the light beams are able to continue the polymerization process to generate the desired in-plane lightguide structures.

When implementing curved light deflecting structures 120A-1 to 120A-3 to deflect light as described above, the low index contrast between exposed and unexposed materials (e.g., delta n approximately equal to 0.02) may require the bend structure to have a relatively large radius, and thus have relatively large volume in order to make a full 90° turn. If this geometric requirement creates production problems or requires excessive writing time, then it may be necessary to generate reflective-type light deflection structures, such as those described reference to the following embodiments.

Figure 4A:
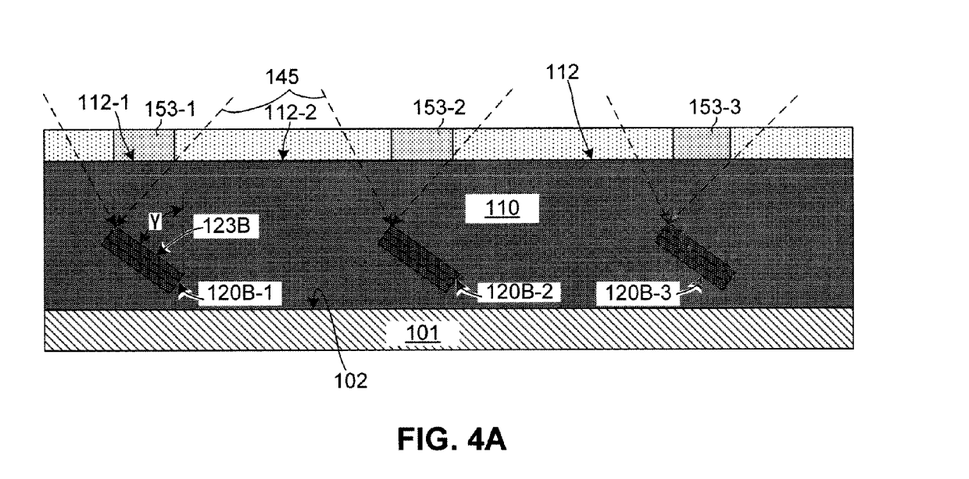
FIGS. 4A and 4B are cross-sectional diagrams depicting the fabrication of in-plane light-guide structures according to a second exemplary embodiment of the present invention.
Figure 4B:
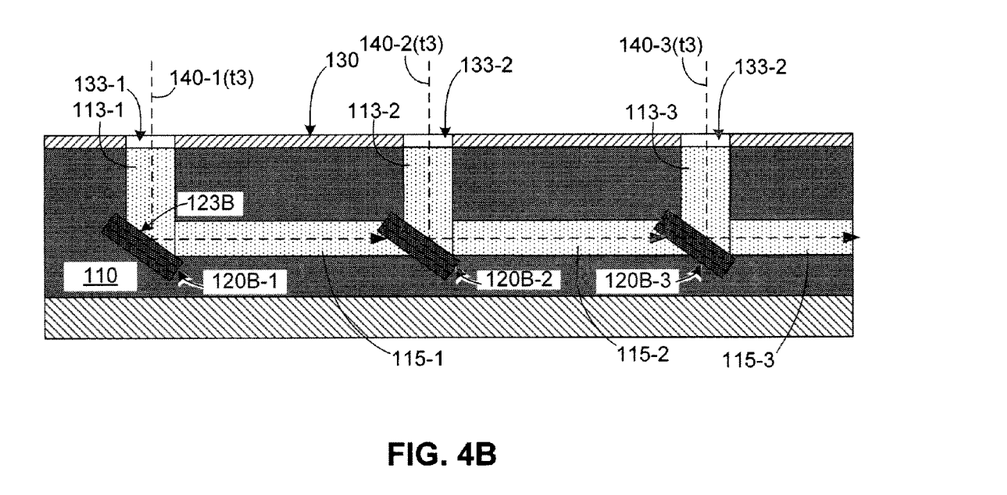

FIGS. 4A and 4B depict the fabrication of a partial microtruss structure 100B using light reflecting structures according to a second exemplary embodiment in which the 2-Photon-Lithography process utilized in the previous embodiment is modified to generate reflective-type light reflecting structures.

FIG. 4A shows a uncured layer 110 including three embedded light deflecting structures 120C-1 to 120C-3 disposed between upper surface 112 and support surface 102, with resist layer 150 formed on upper surface 112. FIG. 4A also shows laser beams 145 produced during a 2-Photon-Lithography process that are controlled using known techniques such that portions of uncured layer 110 are polymerized to form three multi-layer Bragg-type (reflective) light deflecting structures 120B-1 to 120B-3 having respective outer surfaces 123B disposed at an acute angle γ (e.g., 45°) relative to upper surface 112. Bragg-type light deflecting structures 120B-1 to 120B-3 are formed by generating several polymer layers in stacks, where successive layers have alternating (but small) refractive index changes. To prevent the Bragg stack from becoming entirely exposed (and therefore of homogeneous refractive index, and devoid of the reflective property), additional measures may be required between the serial (e.g., 2-Photon-Lithography) deflection element writing process and the subsequent parallel self-write (i.e., lightguide generating) process. For example, it may be possible to preserve some of the Bragg-reflectivity by performing an intermediate-bake process between the serial writing process shown in FIG. 4A and the subsequent parallel self-writing process shown in FIG. 4B. As in the previous embodiment, the 2-Photon-Lithography process is also used to develop sections 153-1 to 153-3 of photoresist layer 150 so as to reliably align light deflecting structures 120B-1 to 120B-3 with subsequently formed mask apertures.

FIG. 4B shows subsequent processing during which collimated light passing through apertures 133-1 to 133-3 defined in a mask layer 130 produce light beams 140-1 to 140-3 to generate vertical (first) self-propagating polymer lightguide sections 113-1 to 113-3 between upper layer surface 112 and outer surface 123B of associated reflective-type light deflecting structures 120B-1 to 120B-3, respectively, and horizontal (second) self-propagating polymer lightguide sections 115-1 to 115-3 extending from associated outer surfaces 123B into uncured layer 110. In this case, light beams 140-1 to 140-3 are respectively reflected (i.e., instead of refracted) into the desired "in-plane" (horizontal) direction by reflective-type light deflecting structures 120B-1 to 120B-3.

FIGS. 5A-5D depict the fabrication of a partial micro-truss structure 100C according to a third exemplary embodiment. This embodiment provides an alternative approach for generating light deflecting structures without using 2-Photon Lithography, and involves depositing or otherwise forming light deflecting elements during a layer-by-layer uncured material deposition process.

Figure 5A:
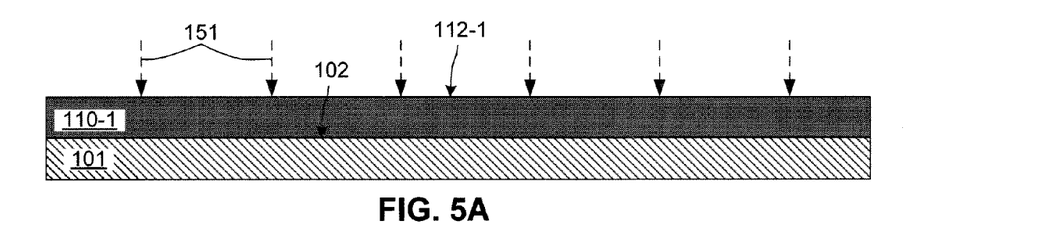
FIGS. 5A, 5B, 5C and 5D are cross-sectional diagrams depicting the fabrication of in-plane lightguide structures according to a third exemplary embodiment of the present invention.

FIG. 5A shows a lower (first) uncured material layer portion 110-1 that is deposited on upper surface 112 of a support substrate 101, where lower layer portion 110-1 has an upper surface 112-1. This deposition process is distinguished from previous embodiments in that the thickness (depth) of layer portion 110-1 layer is approximately 50% or less of the desired final uncured layer thickness.

Figure 5B:
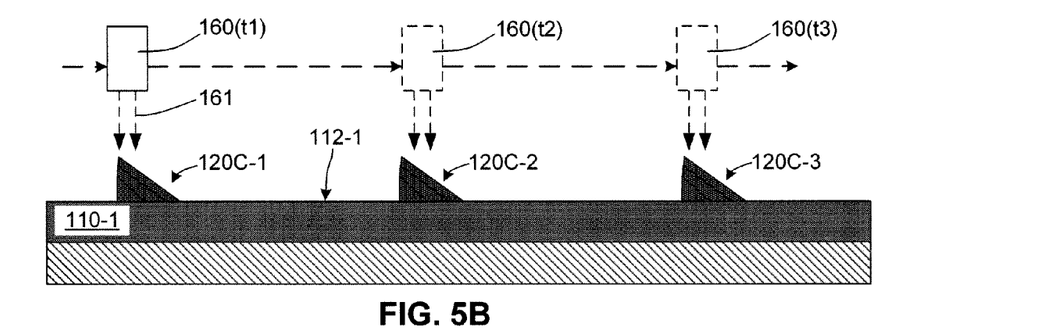

FIG. 5B depicts the formation of spaced-apart reflective-type light deflecting structures 120C-1 to 120C-3 on upper surface 112-1 of lower layer portion 110-1 using an inkjet system 160 to serially print reflective materials (e.g., metals) in a manner that forms reflective-type light deflecting structures having reflective surfaces 123C that form angles γ (e.g., 45°) relative to upper surface 112-1. Although depicted as wedge-shaped reflective structures, light deflecting structures 120C-1 to 120C-3 are produced with one of several possible suitable forms (e.g., metal flakes, metal-V-shapes, silvered prisms or microscale pentaprisms, the latter having the additional benefit of reflecting light by 90° across a range of variable prism attitudes). In addition to inkjet system 160, other suitable printing or formation techniques (e.g., photolithographic patterning) may be used to form light deflecting structures 120C-1 to 120C-3 on lower layer portion 110-1.

Figure 5C:
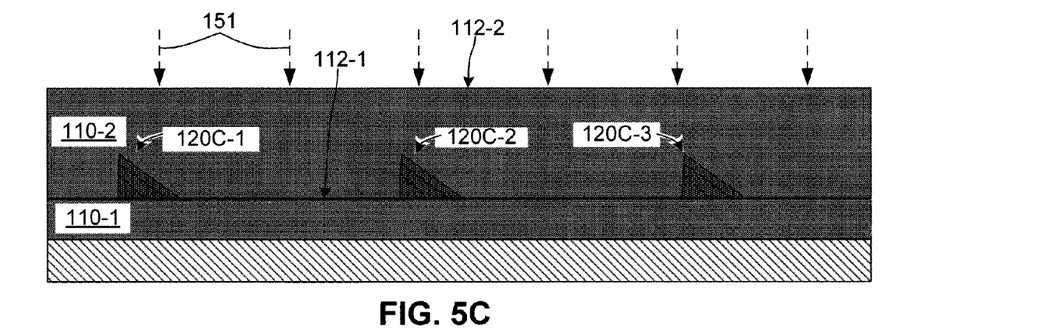

FIG. 5C depicts the subsequent deposition of an upper (second) uncured material layer portion 110-2 over lower layer portion 110-1 and light deflecting structures 120C-1 to 120C-3 such that the light deflecting structures are covered by (embedded inside) uncured material and disposed between an upper surface 112-2 of upper layer portion 110-2 and support surface 102.

Figure 5D:
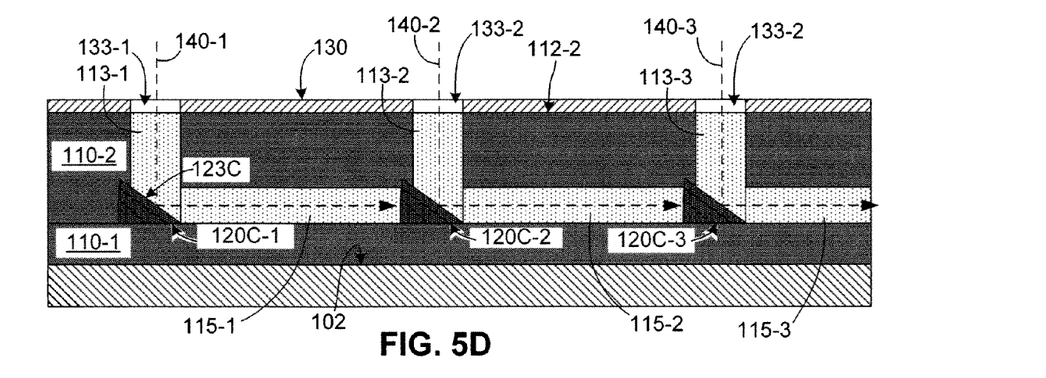

FIG. 5D shows the multi-layer structure of FIG. 5C after mask layer 130 is formed and patterned on upper surface 112-2 using known techniques, and while collimated light is directed perpendicular to upper surface 112-2 such that light beams 140-1 to 140-3 respectively pass through apertures 133-1 to 133-3 in a manner similar to that described above. In this case, light beams 140-1 to 140-3 respectively generate vertical (first) self-propagating polymer lightguide sections 113-1 to 113-3 that extend between upper surface 112-2 and surface 123C of an associated reflective-type light deflecting structure 120C-1 to 120C-3, and horizontal (second) self-propagating polymer lightguide sections 115C-1 to 115C-3 extending from reflective surfaces 123C into the uncured material.

FIGS. 6A to 6F illustrate another practical embodiment in which the enhanced self-writing process of the present invention combines the novel in-plane element fabrication process with the (fast) parallel self-writing techniques associated with the conventional methodology. In particular, FIGS. 6A-6F depict the fabrication of a micro-truss structure including both diagonal structural elements that are connected by and a single elongated horizontal structural element.

Figure 6A:
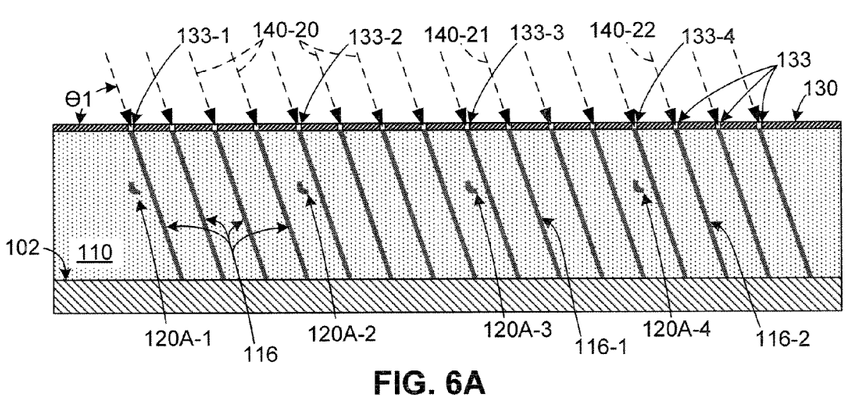
FIGS. 6A, 6B, 6C, 6D, 6E and 6F are cross-sectional diagrams depicting the fabrication of a micro-truss structure according to a fourth exemplary embodiment of the present invention.

FIG. 6A shows a uncured layer 110 including four embedded light deflecting structures 120A-1 to 120A-4 disposed between upper surface 112 and a support surface 102, with a mask layer 130 formed and patterned using techniques described above such that each light deflecting structure 120A-1 to 120A-4 is disposed directly below an associated mask aperture 133-1 to 133-4. In this embodiment, light deflecting structures 120A-1 to 120A-4 have the curved light deflecting structure described above with reference to FIGS. 3A to 3I.

Figure 6B:
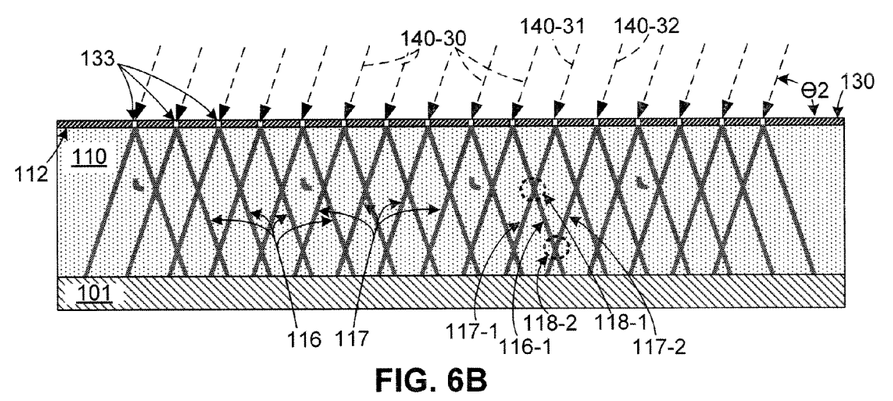

FIGS. 6A and 6B depict a self-write process utilized to generate diagonal truss elements according to the conventional parallel self-write method in which (second) collimated light is directed through apertures 133 at two incident angles onto uncured layer 110 such that elongated (third) portions of the uncured material are polymerized to form (third) diagonal self-propagating polymer lightguides. Specifically, FIG. 6A depicts a first self-write process in which collimated light 140-20 is directed through apertures 133 at a first incident angle θ1 (e.g., in a range of 30 to 40 degrees relative to normal) such that respective collimated light beams (e.g., beams 140-21 and 140-22) form parallel diagonal self-propagating polymer lightguides 116 (e.g., lightguides 116-1 and 116-2) extending between upper surface 112 and support surface 102, and FIG. 6B depicts a subsequent second self-write process in which collimated light 140-30 is directed through apertures 133 at a second incident angle θ2 such that respective collimated light beams (e.g., beams 140-31 and 140-32) form parallel diagonal self-propagating polymer lightguides 117 (e.g., lightguides 117-1 and 117-2) extending between upper surface 112 and support surface 102. In this example incident angles θ1 and θ2 are selected such that lightguides 117 are disposed in single vertical plane, whereby adjacent diagonal lightguides form interconnecting joints at their respective intersections (e.g., as indicated in FIG. 6B, lightguide 116-1 forms a first interconnecting joint 118-1 at an intersection with lightguide 117-1 and a second interconnecting joint 118-2 at an intersection with lightguide 117-2), whereby the interconnected lightguide sections 116 and 117 collectively form a partial two-dimensional micro-truss structure.

Figure 6C:
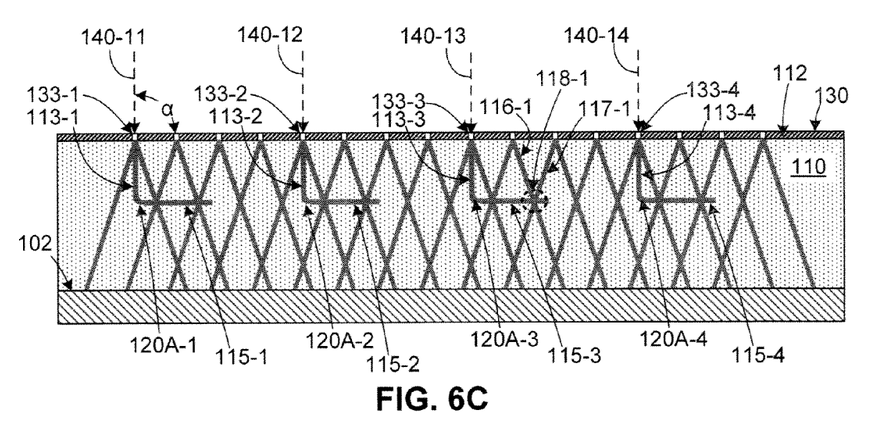

FIG. 6C depicts the subsequent formation of horizontal (second) self-propagating polymer lightguide sections 115-1 to 115-4 using one of the techniques described above such that each horizontal section intersects and forms an interconnecting joint with diagonal lightguides 116 and 117. Specifically, a single collimated light source is directed at angle α (i.e., perpendicular to upper surface 112) such that light beams 140-11 to 140-14 respectively pass through apertures 133-1 to 133-4, thereby respectively forming vertical (first) self-propagating polymer lightguide sections 113-1 to 113-4 that extend substantially perpendicular to upper surface 112 into uncured layer 110. Embedded light deflecting structures 120A-1 to 120A-4 are respectively positioned and oriented below apertures 133-1 to 133-4 such that collimated light beams 140-1 to 140-4 are respectively redirected in a horizontal direction (i.e., substantially parallel to upper surface 112), thereby polymerizing a horizontal cylindrical region of the uncured material to respectively form horizontal (second) self-propagating polymer lightguide sections 115-1 to 114-4 that intersect and join with diagonal self-propagating polymer lightguides 116 and 117. For example, horizontal lightguide section 115-3 intersects and becomes interconnected with diagonal lightguides 116-1 and 117-1 at joint 118-1. In this way, micro-truss structure 100D, which at this time is disposed inside uncured layer 110, is modified using self-write techniques and only one collimated light source to include horizontal structural members (i.e., horizontal lightguide sections 115-1 to 115-4).

Figure 6D:
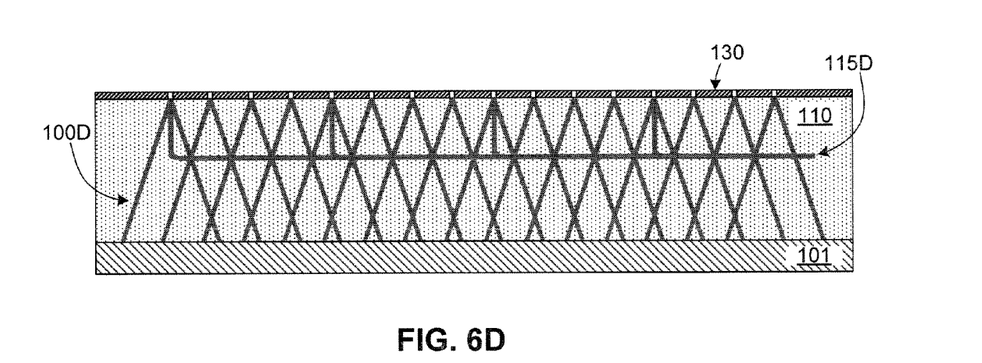

FIG. 6D shows completed micro-truss structure 100D still encased in the remaining non-polymerized material forming uncured layer 110, and connected between mask 130 and support substrate 101. As depicted, the horizontal self-writing process is completed when each in-plane lightguide segments encounters an associated light deflecting structure, thereby forming an elongated horizontal structural element 115D that interconnects multiple diagonal elements making up micro-truss structure 100D.

Figure 6E:
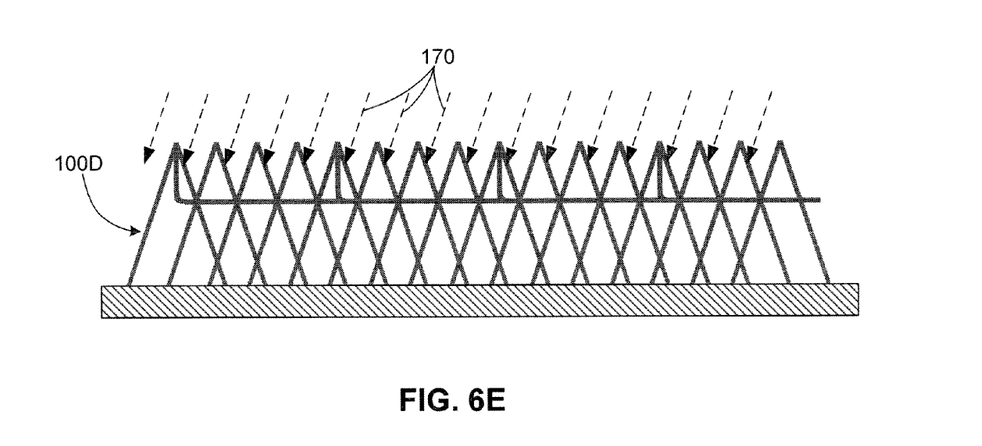
Figure 6F:
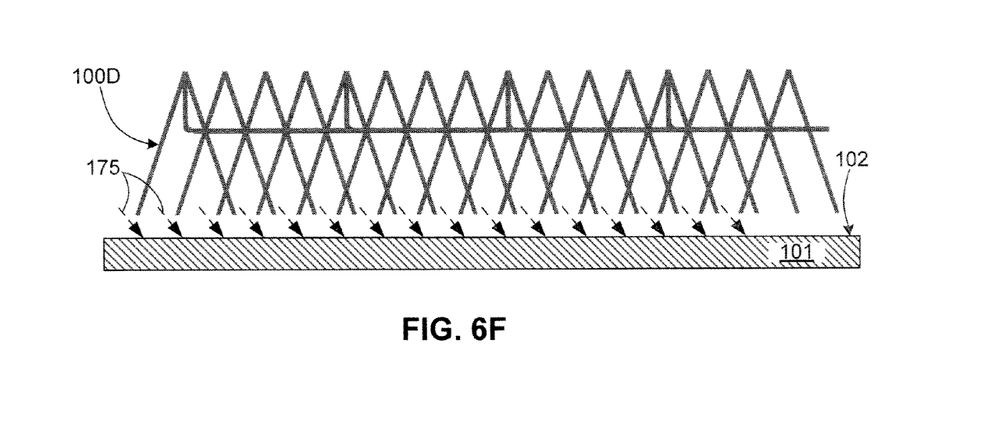

FIGS. 6E and 6F depict optional finishing processes utilized to prepare micro-truss 100D for further processing and use. FIG. 6E depicts the development and removal of the mask and unused uncured material using a suitable developer 170, thereby exposing micro-truss framework 100D. FIG. 6F depicts the subsequent detachment of micro-truss framework 100D from upper surface 102 of support substrate 101. The completion process also involves cleaning and stiffening (e.g., conducting a thermal-curing to stiffen the polymer framework). By incorporating the present method novel horizontal-element fabrication process with the conventional parallel self-writing techniques in this manner, the combined methodology produces micro-truss structure 100D including diagonal structural elements that are interconnected with vertical and horizontal structural elements, thereby facilitating the large formation of superior micro-trusses.

Figure 7:
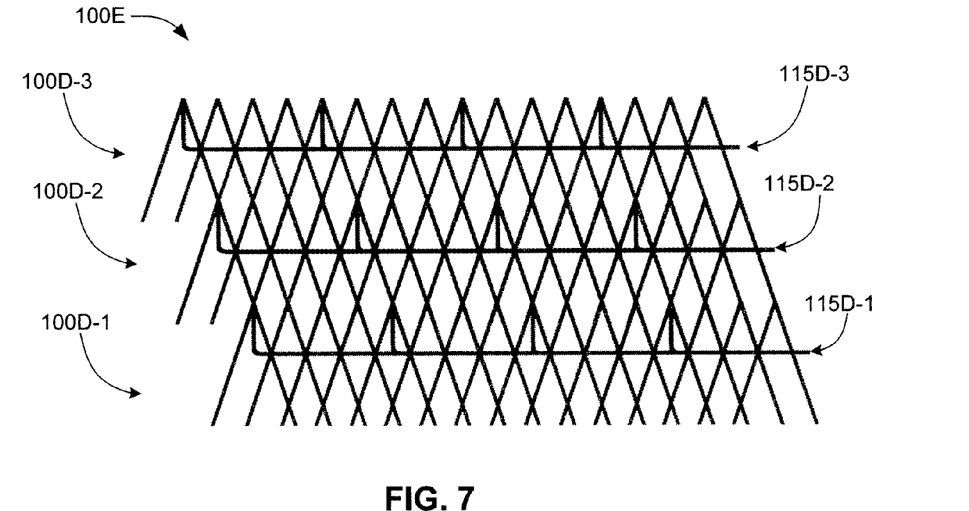
FIG. 7 is a cross-sectional diagram depicting a multiple-layer micro-truss structure according to a fifth exemplary embodiment of the present invention.

FIG. 7 depicts a multiple-layer micro-truss structure 100E formed by generating three single-layer micro-truss structures 100D-1, 100D-2 and 100D-3 in consecutive fabrication processes according to another exemplary embodiment. Specifically, after forming micro-truss structure 100D-1 in accordance with the method described above with reference to FIGS. 6A to 6D (i.e., while micro-truss structures 100D-1 is still encased in uncured material), a second layer of uncured material is formed over micro-truss structure 100D-1, and second micro-truss structure 100D-2 is fabricated by repeating the process described above with reference to FIGS. 6A to 6D such that the diagonal lightguides of micro-truss structure 100D-1 are aligned with those of micro-truss structure 100D-1. Similarly, after micro-truss structure 100D-2 is completed, a third layer of uncured material is formed over micro-truss structure 100D-2, and third micro-truss structure 100D-3 is fabricated by repeating the process described above. The resulting multiple-layer micro-truss structure 100E is thus formed with horizontal lightguide elements 115D-1 to 115D-3 disposed at three vertical depths. As discussed above, an alternative approach to forming micro-truss structures having horizontal lightguides elements disposed at multiple vertical depths is to form a single uncured material with light deflecting elements disposed at each of the multiple vertical depths.

Figure 8:
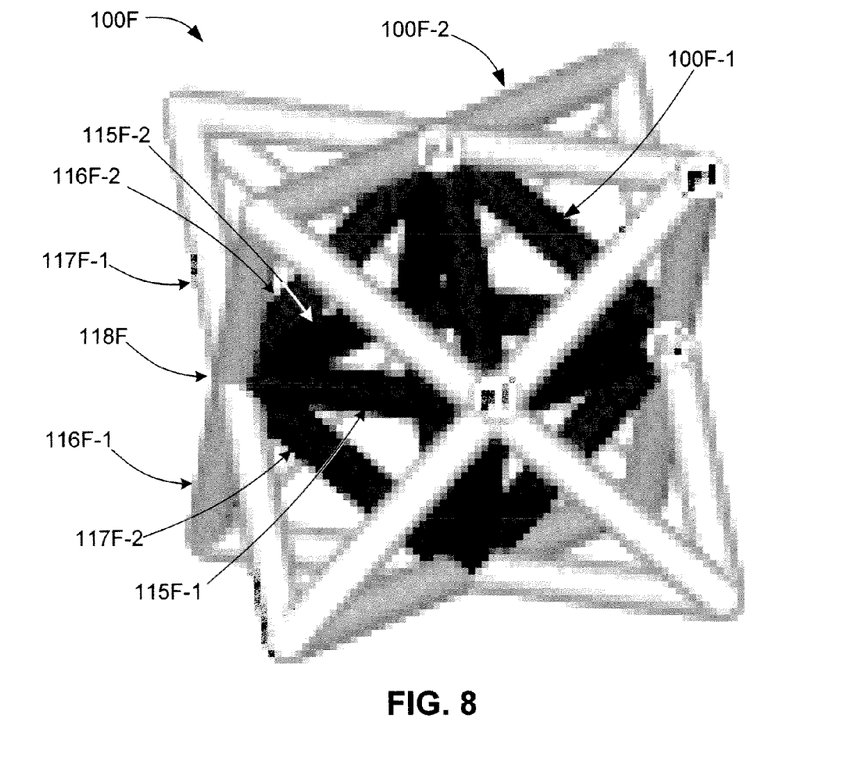
FIG. 8 is a perspective view depicting a unit structure for a micro-truss structure fabricated in accordance with a sixth exemplary embodiment of the present invention.

FIG. 8 is a perspective view depicting a three-dimensional (3D) space frame unit 100F having the ideal "octet truss" topology, which is generated by repeating the process described above with reference to FIGS. 6A to 6D in a way that generates a 3D framework made up of space frame units 100F. Specifically, space frame unit (3D framework) 100F combines the in-plane lightguide fabrication method described above with the conventional parallel self-writing method to generate a diamond-shaped inner frame 100F-1 (formed by the dark-shaded elements) surrounded by a box-like outer frame 100F-2 (formed by the light-colored elements), where each joint section (e.g., joint 118F) if formed by interconnecting four diagonal lightguides (e.g., diagonal lightguides 116F-1, 116F-2, 117F-1 and 117F-2) and two horizontal lightguides (e.g., horizontal lightguides 115F-1 and 115F-2). Space frame unit 100F demonstrates that combining the novel horizontal-element fabrication process with parallel self-writing techniques facilitates the formation of superior micro-truss structures without resorting to writing the bulk of the structure with a slow serial method, as required in the prior art.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A method for forming a micro-truss structure, the method comprising:
   forming an uncured layer on a support surface such that the uncured layer includes at least one light deflecting structures disposed between an upper surface of the uncured layer and the support surface;
   directing collimated light beams through the upper surface of the uncured layer at parallel first incident angles such that each collimated light beam:
      polymerizes a first elongated portion of the uncured layer to form a first self-propagating polymer lightguide section extending between the upper surface of the uncured layer and an associated light deflecting structure of said plurality of light deflecting structures, and
      deflects from said associated light deflecting structure such that said deflected collimated light beam polymerizes a second elongated portion of the uncured layer to form a second self-propagating polymer lightguide section extending from said associated light deflecting structure into said uncured layer.

2. The method of claim 1,
   wherein directing said collimated light beams comprises directing said collimated light beams substantially perpendicular to the upper surface, whereby each said first self-propagating polymer lightguide section extends substantially perpendicular to the upper surface of the uncured layer, and
   wherein said at least one light deflecting structure is arranged such that directing said collimated light beams in said substantially perpendicular causes each said second self-propagating polymer lightguide section to extend substantially parallel to the upper surface of the uncured layer.

3. The method of claim 1, wherein forming said uncured layer comprises:
   depositing a uncured material on a support substrate; and
   utilizing laser light to form said plurality of light deflecting structures by polymerizing corresponding portions of said deposited uncured material.

4. The method of claim 3, wherein utilizing laser light comprises performing a 2-Photon-Lithography process.

5. The method of claim 4, further comprising:
   forming a photoresist layer on the upper surface of the uncured layer;
   developing a plurality of spaced-apart photoresist portions of said photoresist layer during said 2-Photon-Lithography process;
   removing undeveloped portions of said photoresist layer such that portions of the upper surface of the uncured layer are exposed between a plurality of spaced-apart developed photoresist structures;
   depositing a mask material such that first mask material portions are disposed on said spaced-apart developed photoresist structures and second mask material portions form a mask layer on the exposed portions of the upper surface; and
   removing the plurality of spaced-apart developed photoresist structures and the first mask material portions to define a plurality of apertures through said mask layer.

6. The method of claim 4, wherein performing said 2-Photon-Lithography process further comprises controlling said laser light to polymerize third portions of the uncured layer such that each said polymerized third portion forms an associated curved lightguide section having a first end facing the upper surface of the uncured layer and a second end facing a direction that is substantially parallel to the upper surface of the uncured layer.

7. The method of claim 6, wherein forming each said first self-propagating polymer lightguide section comprises directing said collimated light beam such that said first self-propagating polymer lightguide section extends between the upper surface and the first end of said associated curved lightguide section, and such that said collimated light beam is redirected by said associated curved lightguide section and forms said second self-propagating polymer lightguide section extending from said second end into said uncured layer.

8. The method of claim 4, wherein performing said 2-Photon-Lithography process further comprises controlling said laser light to polymerize third portions of the uncured layer such that each said polymerized third portion forms an associated multi-layer reflective structure having a surface disposed at an acute angle relative to the upper surface.

9. The method of claim 8, wherein forming each said first self-propagating polymer lightguide section comprises directing said collimated light beam such that said first self-propagating polymer lightguide section extends between the upper surface and the surface of said associated multi-layer reflective structure, and such that second self-propagating polymer lightguide section extending from said surface into said uncured layer.

10. The method of claim 1, wherein forming said uncured layer comprises:
   depositing a first uncured material layer portion over a support substrate;

forming said plurality of light deflecting structures on said first uncured material layer portion; and depositing a second uncured material layer portion over the first uncured material layer portion and said plurality of light deflecting structures.

11. The method of claim 10, wherein forming said plurality of light deflecting structures comprises depositing spaced-apart reflective material portions onto said first uncured material layer portion using an inkjet printing system.

12. The method of claim 10, wherein forming each said first self-propagating polymer lightguide section comprises directing said collimated light beam such that said first self-propagating polymer lightguide section extends between the upper surface and a surface of said associated spaced-apart light deflecting structures, and such that second self-propagating polymer lightguide section extends horizontally from each said reflective surface.

13. The method of claim 1, further comprising:

directing second collimated light beams at one or more incident angles onto said uncured layer such that second collimated light beams polymerize elongated third portions of the uncured layer to form a plurality of third self-propagating polymer lightguides extending between the upper surface and the support surface, wherein said plurality of light deflecting structures are positioned and oriented such that said second self-propagating polymer lightguide sections intersect one or more of said plurality of third self-propagating polymer lightguides, whereby said second self-propagating polymer lightguide sections are connected to said one or more of said plurality of third self-propagating polymer lightguides to form said micro-truss structure disposed inside said uncured layer.

14. The method of claim 13, further comprising removing non-polymerized portions of said uncured layer and detaching said micro-truss structure from said support surface.

15. The method of claim 13, wherein forming said plurality of third self-propagating polymer lightguides and said plurality of second self-propagating polymer lightguide sections comprises interconnecting said second and third self-propagating polymer lightguides to form a three-dimensional framework.

16. The method of claim 15, wherein forming said three-dimensional framework comprises forming an octet-truss structure.

17. A method for forming a micro-truss structure, the method comprising:

forming a uncured layer on a support surface;

disposing a plurality of light deflecting structures in said uncured layer such that said plurality of light deflecting structures are located between an upper surface of the uncured layer and the support surface said uncured layer, polymerizing elongated diagonal portions of the uncured layer to form a plurality of diagonal self-propagating polymer lightguides extending diagonally between the upper surface of the uncured layer and the support surface; and polymerizing elongated horizontal portions of the uncured layer to form a plurality of horizontal self-propagating polymer lightguides extending parallel to the upper surface of the uncured layer and disposed between the upper surface and the support surface, each said horizontal self-propagating polymer lightguide forming a junction with one or more of said plurality of diagonal self-propagating polymer lightguides, whereby said horizontal and diagonal self-propagating polymer lightguide sections form said micro-truss structure, wherein polymerizing said elongated horizontal portions comprises directing collimated light beams into said uncured layer such that each of said collimated light beams is deflected by an associated light deflecting structure and polymerizes an associated said elongated horizontal portion extending from said associated light deflecting structure.

18. A method for forming one or more in-plane lightguides, the method comprising:

forming a uncured layer on a support surface such that the uncured layer includes a light deflecting structure; and directing collimated light onto said light deflecting structure such that said collimated light is deflected in a transverse direction and polymerizes an elongated portion of the uncured layer to form a self-propagating polymer lightguide extending from said light deflecting structure.

19. The method of claim 18, wherein forming said uncured layer comprises forming a plurality of light deflecting structures between an upper surface of the uncured layer and the support surface;

wherein the method further comprises forming a mask layer defining a plurality of apertures on the upper surface of the uncured layer, and wherein directing the collimated light comprises directing said collimated light onto said mask layer such that a collimated light beam passes through each said aperture and is deflected in said transverse direction by an associated one of said plurality of light deflecting structures.

* * * * *